United States Patent
Camy et al.

(10) Patent No.: US 12,046,867 B2
(45) Date of Patent: Jul. 23, 2024

(54) LASER CRYSTAL WITH AT LEAST TWO CO-DOPANTS

(71) Applicants: COMMISSARIAT A L'ENERGIE ATOMIQUE ET AUX ENERGIES ALTERNATIVES, Paris (FR); UNIVERSITE DE CAEN NORMANDIE, Caen (FR); ENSICAEN, Caen (FR); CENTRE NATIONAL DE LA RECHERCHE SCIENTIFIQUE, Paris (FR)

(72) Inventors: Patrice Camy, Caen (FR); Alain Braud, Caen (FR); Jean-Louis Doualan, Caen (FR); Abdel Benayad, Caen (FR); Jean-Paul Goossens, Le Barp (FR)

(73) Assignees: COMMISSARIAT A L'ENERGIE ATOMIQUE ET AUX ENERGIES ALTERNATIVES, Paris (FR); UNIVERSITE DE CAEN NORMANDIE, Caen (FR); ENSICAEN, Caen (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 664 days.

(21) Appl. No.: 17/289,049

(22) PCT Filed: Oct. 30, 2019

(86) PCT No.: PCT/FR2019/052578
§ 371 (c)(1),
(2) Date: Apr. 27, 2021

(87) PCT Pub. No.: WO2020/089563
PCT Pub. Date: May 7, 2020

(65) Prior Publication Data
US 2021/0408756 A1     Dec. 30, 2021

(30) Foreign Application Priority Data

Oct. 31, 2018   (FR) .................................. 1860115

(51) Int. Cl.
*H01S 3/16*     (2006.01)
*C09K 11/77*    (2006.01)
(Continued)

(52) U.S. Cl.
CPC ........ *H01S 3/1698* (2013.01); *C09K 11/7773* (2013.01); *C30B 29/12* (2013.01);
(Continued)

(58) Field of Classification Search
CPC ...... H01S 3/165; C30B 29/12; C09K 11/7773
See application file for complete search history.

(56) References Cited

U.S. PATENT DOCUMENTS 5,289,481 A * 2/1994 Xie .................... H01S 3/094
                                                   372/18
5,299,210 A * 3/1994 Snitzer .............. H01S 3/094003
                                                  385/115
(Continued)

FOREIGN PATENT DOCUMENTS

CN     1676680 A      10/2005
CN     1292105 C  *  12/2006
(Continued)

OTHER PUBLICATIONS

International Search Report issued on Mar. 6, 2020 in PCT/FR2019/052578 filed on Oct. 30, 2019, 3 pages.
(Continued)

*Primary Examiner* — Joshua King
(74) *Attorney, Agent, or Firm* — Oblon, McClelland, Maier & Neustadt, L.L.P.

(57) ABSTRACT

An active laser medium for emitting a light beam by laser effect includes an X—F2-doped crystal, wherein X is a
(Continued)

chemical element from the alkaline-earth family and F is fluorine. The crystal is doped with trivalent ions including: a first category of optically active dopant ions, in which each dopant ion is an ion of a first rare earth; and a second category of optically inactive dopant ions, referred to as buffer ions, in which each dopant ion is an ion of a rare earth different from the first rare earth. The second category of dopant ions has at least ions of a second rare earth and ions of a third rare earth, different from one another. The invention provides an active laser medium that can be used to obtain both a desired emission spectrum shape and a high thermal conductivity.

15 Claims, 3 Drawing Sheets

(51) Int. Cl.
    *C30B 29/12*     (2006.01)
    *H01S 3/23*     (2006.01)

(52) U.S. Cl.
    CPC .......... *H01S 3/1611* (2013.01); *H01S 3/1618* (2013.01); *H01S 3/165* (2013.01); *H01S 3/2316* (2013.01)

(56) References Cited

U.S. PATENT DOCUMENTS

| | | | | |
|---|---|---|---|---|
| 5,555,342 A | * | 9/1996 | Buchal | H01S 3/0632 372/39 |
| 6,356,699 B1 | * | 3/2002 | Bartholomew | C03C 3/095 385/144 |
| 6,636,347 B1 | * | 10/2003 | Wang | C03C 13/046 359/341.5 |
| 2008/0080823 A1 | * | 4/2008 | Gray | H01S 3/06716 385/127 |

FOREIGN PATENT DOCUMENTS

| | | | | |
|---|---|---|---|---|
| CN | 106673658 A | * | 5/2017 | ........... C04B 35/553 |
| CN | 106701082 A | * | 5/2017 | |
| CN | 107740186 A | * | 2/2018 | |
| CN | 107740186 A | | 2/2018 | |
| CN | 109023523 A | * | 12/2018 | ............. C30B 11/00 |
| JP | 2002540247 A | * | 2/2000 | |
| JP | 2008169065 A | * | 7/2008 | |
| WO | WO-03063308 A1 | * | 7/2003 | ......... H01S 3/06716 |
| WO | WO-2005074573 A2 | * | 8/2005 | ............. G02B 6/105 |

OTHER PUBLICATIONS

French Preliminary Search Report (with English translation of Categories of Cited Documents) issued on Jul. 17, 2019 in French Application 1860115 filed on Oct. 31, 2018, 2 pages.

Petit, V. et al., "Spectroscopy and tunable laser operation of $Yb^{3+}:CaF_2$ single crystals," Proceedings of SPIE, vol. 5460, 2004, pp. 123-131, XP055319795.

Soulard, R. et al., "Co-doping Nd : $CaF_2$ with buffer ions for inertial fusion application," OSA Laser Congress 2018 (ASSL, LAC), 2018, 2 total pages, XP055605690.

Normani, S. et al., "Site selective analysis of $Nd^{3+}$-$Lu^{3+}$ codoped $CaF_2$ laser crystals," CrystEngComm, vol. 18, 2016, pp. 9016-9025, XP055605506.

* cited by examiner

LASER CRYSTAL WITH AT LEAST TWO CO-DOPANTS

TECHNICAL FIELD

The invention relates to the field of amplifying media, capable of emitting and/or amplifying a light beam by laser effect.

STATE OF PRIOR ART

The invention applies to the field of laser devices, where laser is the acronym for "light amplification by stimulated emission of radiation". In a laser device, an amplifying medium, or gain medium, receives excitation energy in electrical or optical form. This excitation, or pumping, energy, enables some of its atoms to be brought to a high energy level (population inversion). Atoms located at a high energy level can spontaneously fall back to a low energy level, with the emission of a photon. This is called spontaneous emission. Return to a low energy level can be facilitated by the arrival of an incident photon the energy of which corresponds to the difference in energy between the high and low energy levels. This is called stimulated emission. Stimulated emission performs a light amplification, since the incident photon causes the emission of at least one other photon having the same energy. This light amplification by stimulated emission is called the "laser effect". The amplifying medium, or laser medium, can amplify an incident light beam, by stimulated emission, within a device called a laser amplifier. Alternatively, the amplifying medium can emit a light beam from initial photons emitted by spontaneous emission and initiating cascade stimulated emissions. In this second case, the amplifying medium extends into an optically resonant cavity at the wavelength of the stimulated emission, within a device called a laser oscillator. Different amplifying media are known in prior art, especially the solid amplifying media which include doped crystals and doped glasses.

Doped glasses have the advantage of having amplification spectra with a full width at half maximum of several nanometres. (Similarly, doped glasses present absorption spectra with a full width at half maximum of several nanometres).

It is reminded here that an amplification spectrum of an amplifying medium represents the spectral distribution of the gain of said amplifying medium. In other words, it is the amplification (spectral gain) provided by the amplifying medium on a light beam injected as an input to the latter, as a function of the wavelength of said injected beam. A fluorescence spectrum of an amplifying medium represents in turn the spatial distribution of emission of said amplifying medium, without any amplification mechanism. An amplification spectrum (like a fluorescence spectrum) of an amplifying medium always has a shape close to a Gaussian on which different indicators can be defined, such as the full width at half maximum (called the width of the spectrum) and the central wavelength (or central wavelength of the spectrum). The spectral band over which the spectrum is above half of its maximum value is called the "amplification spectral band".

Doped glasses, on the other hand, are poor thermal conductors, with a thermal conductivity lower than 1 $W \cdot m^{-1} \cdot K^{-1}$. This low thermal conductivity limits possibilities of removing heat supplied with the excitation energy, which is detrimental to the efficiency of the laser amplification for a clocked operation of this laser.

Doped crystals in turn have very good thermal conductivity, generally between 9 and 11 $W \cdot m^{-1} \cdot K^{-1}$.

The simplest example of a doped crystal is a crystal in which some of the ions are replaced by a so-called optically active dopant ion, originating the phenomenon of stimulated emission predominant in the crystal. A drawback of such doped crystals is that they have narrow amplification spectral bands. Recent studies have shown that these narrow amplification bands are due especially to the formation of aggregates gathering several optically active ions in the doped crystal. These ions aggregate together in reaction to local electrical imbalances formed by ion replacements in the crystal. These aggregates originate a phenomenon of fluorescence quenching, which limits efficiency of laser amplification and reduces the amplification spectral band.

Crystals doped with both optically active ions, to obtain the laser effect, and with so-called buffer ions have then been provided. Buffer ions do not directly participate in the laser effect. They simply allow the optically active ions to aggregate with buffer ions rather than with other optically active ions. This limits the phenomenon of fluorescence quenching, which enables broader spectral amplification bands to be obtained. Such a crystal is described in the paper by S. Normani & al, "Site selective analysis of $Nd^{3+}$—$Lu^{3+}$ codoped $CaF_2$ laser crystals", CrystEngComm 18 Jan. 2016. In this paper, the authors describe a $CaF_2$ crystal doped with both $Nd^{3+}$ ions, to obtain the laser effect, and $Lu^{3+}$ ions, to block $Nd^{3+}$ ions in aggregates of one $Nd^{3+}$ ion and one $Lu^{3+}$ ion, thereby preventing the formation of aggregates of two $Nd^{3+}$ ions. This results in an amplification spectrum centred at about 1050 nm, which is broader than in the absence of buffer ions in the doped crystal. In contrast, the amplification spectrum proves to be highly structured, namely with strong gradient bounces about the maximum.

One purpose of the present invention is to provide an amplifying medium for emitting and/or amplifying a light beam by laser effect, which makes it possible to offer both a high thermal conductivity, greater than that of a doped glass, and a broad low structured amplification spectrum.

DISCLOSURE OF THE INVENTION

This purpose is achieved with an amplifying medium for emitting and/or amplifying a light beam by laser effect, consisting of an X—$F_2$ doped crystal, where X refers to a chemical element of the alkaline earth family and F refers to fluorine, and where the crystal is doped with trivalent ions of rare earth, called dopant ions, said dopant ions comprising:

a first category of dopant ions, called optically active ions, in which each dopant ion is an ion of a first rare earth; and a second category of dopant ions, optically inactive, called buffer ions, in which each dopant ion is an ion of a rare earth distinct from the first rare earth.

According to the invention, the second category of dopant ions includes at least ions of a second rare earth and ions of a third rare earth, the second rare earth and the third rare earth being distinct from each other.

The amplifying medium thus forms a doped crystal, with a thermal conductivity close to that of a crystal and much higher than that of a glass.

By virtue of the buffer ions, the formation of aggregates of several optically active ions is avoided. This limits phenomena of the fluorescence quenching type, originating a drop in energy efficiency, and an amplification spectrum broader than with a crystal that would be doped only with optically active ions is obtained.

Further, by using two types of buffer ions, corresponding to two rare earths distinct from each other, a broader less structured amplification spectrum than with only one type of buffer ion can be obtained. In particular, a value close to the maximum can be maintained over a broad spectral band. For example, an amplitude greater than or equal to 50% of the maximum can be maintained over a spectral band at least 3 nm broad (1 nm=$10^{-9}$ m) or even at least 5 nm broad.

The fluorescence spectrum of a doped crystal corresponds to an emission spectrum thereof, without any amplification mechanism. The fluorescence spectrum of a doped crystal is generally much broader than its amplification spectrum, but the same trends can be found, especially in terms of spectral width, structuring, and central wavelength. Amplification causes a phenomenon of gain spectral narrowing.

One of the ideas underlying the invention is to compare the fluorescence spectrum of a crystal only doped with optically active ions of a first rare earth and the fluorescence spectrum of the same crystal further doped with buffer ions of a second rare earth. It is noticed that adding buffer ions results especially in the occurrence of a wavelength shift in the fluorescence spectrum. This shift is a function of the rare earth used to form the buffer ions.

The inventors were able to show that by combining several types of buffer ions within the same doped crystal, the fluorescence spectrum gets closer to a linear combination of so-called elemental fluorescence spectra, each associated with the addition of only one of said several types of buffer ions. Depending on the buffer ions combined in the doped crystal according to the invention, given characteristics of the fluorescence spectrum (spectral width, central wavelength, structuring about the maximum with more or less marked bounces, etc.) are obtained. At least two types of buffer ions can thus be selected, so as to obtain a desired shape for the fluorescence spectrum of the doped crystal, and thus a desired shape for its amplification spectrum.

Preferably, the amplifying medium according to the invention has its mass concentration of ions of the second rare earth which is greater than or equal to 1% by mass, and its mass concentration of ions of the third rare earth which is greater than or equal to 1% by mass.

Its mass concentration of ions of the second rare earth is even advantageously greater than or equal to 2% by mass, and its mass concentration of ions of the third rare earth greater than or equal to 2% by mass.

Its mass concentration of buffer ions can be between 4% and 6%.

Preferably, said buffer ions include lutetium, yttrium, gadolinium, lanthanum, scandium and/or cerium ions.

Said buffer ions advantageously include yttrium ions.

Said second category of dopant ions may consist of said ions of the second rare earth and said ions of the third rare earth only. Advantageously, the second rare earth is yttrium and the third rare earth is gadolinium.

Alternatively, said second category of dopant ions may only consist of said ions of the second rare earth, said ions of the third rare earth, and ions of a fourth rare earth distinct from the second and third rare earths.

The chemical element X preferably refers to an element from calcium, strontium and barium.

The amplifying medium according to the invention advantageously consists of a fluorite-doped crystal, where fluorite has the formula $CaF_2$.

The optically active ions can be neodymium ions or ytterbium ions.

The invention also relates to a laser device including an amplifying medium according to the invention, and a light source arranged to emit an excitation light beam in the direction of the amplifying medium, the excitation light beam being capable of optically exciting the amplifying medium so that the latter emits and/or amplifies an auxiliary light beam by laser effect.

The laser device according to the invention may further include a light source capable of emitting a light beam to be amplified in the direction of the amplifying medium, the amplifying medium being capable of amplifying said light beam to be amplified by laser effect.

Finally, the invention relates to a laser system including a plurality of laser devices cascaded one after the other, each laser device comprising an amplifying medium and a light source arranged to emit an excitation light beam in the direction of said amplifying medium, wherein each excitation light beam is capable of optically exciting the corresponding amplifying medium so that the latter emits and/or amplifies a light beam by laser effect, with at least one of said laser devices being a laser device according to the invention.

BRIEF DESCRIPTION OF THE DRAWINGS

The present invention will be better understood upon reading the description of examples of embodiments given purely by way of indicating and in no way limiting purposes, with reference to the appended drawings in which.

DETAILED DISCLOSURE OF PARTICULAR EMBODIMENTS

Throughout the text and examples, amplification spectra refer to spectra obtained for a total gain of $10^9$ (value of the integral of the spectral gain).

Figure 1:
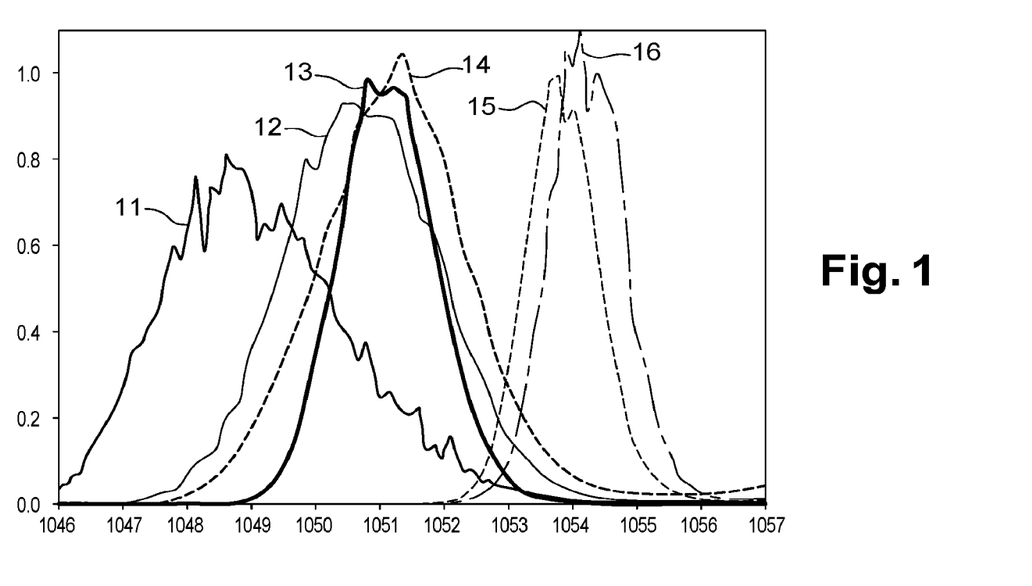
FIG. 1 illustrates the respective amplification spectra of crystals according to prior art, doped with optically active ions of a first rare earth and buffer ions of a second rare earth.

FIG. 1 illustrates respective amplification spectra of a plurality of doped crystals according to prior art. The abscissa axis is a wavelength, in nm. The ordinate axis is the gain of the amplifying medium (or amplification factor), in arbitrary units. The gain of the amplifying medium is a function of the wavelength.

Doped crystals according to prior art are $CaF_2$ crystals doped with trivalent neodymium $Nd^{3+}$ ions and trivalent ions of a rare earth other than neodymium, noted as $Bu^{3+}$. Neodymium ions are called "optically active ions" because they are the ions originating the phenomenon of stimulated emission utilized when the doped crystal is used to emit and/or amplify a beam of light by laser effect. Trivalent ions of another rare earth are called "buffer ions" because they are only used to limit the formation of aggregates of several neodymium ions. Buffer ions do not originate the phenomenon of stimulated emission utilized when the doped crystal is used to emit and/or amplify a light beam by laser effect.

The concentration of neodymium $Nd^{3+}$ ions in the doped crystal is 0.5% by mass.

The concentration of $Bu^{3+}$ buffer ions in the doped crystal is 5% by mass.

The crystal is optically pumped by an excitation light beam at 797 nm.

Curves 11, 12, 13, 14, 15, 16 in FIG. 1 respectively correspond to the amplification spectrum of a crystal in which the buffer ions consist of gadolinium (Gd), cerium (Ce), scandium (Sc), lanthanum (La), lutetium (Lu), and yttrium (Y) ions.

Each of the amplification spectra has a substantially Gaussian form. Each of the amplification spectra is centred on a central wavelength, the value of which is a function of the nature of buffer ions. Here, the central wavelength values are all close to 1052 nm, ranging from 1048 nm to 1055 nm.

It is also noticed that the amplification spectra show strong structuring, namely strong local variations about the maximum.

The idea underlying the invention is to join buffer ions of at least two different types within the same $X-F_2$-doped crystal, where each type of buffer ion relates to a distinct rare earth, where F refers to the chemical element Fluorine, and where X refers to a chemical element of the alkaline earth family (second column of the periodic table of elements, gathering beryllium, magnesium, calcium, strontium, barium and radium). X more particularly refers to a chemical element from calcium (Ca), strontium (Sr) and barium (Ba), and even more preferentially calcium (Ca). The $X-F_2$-doped crystal is doped with optically active ions of a first rare earth, and co-doped with buffer ions of at least two types, where each type relates to a distinct rare earth and distinct from the first rare earth.

The use of buffer ions of at least two types enables a doped crystal to be obtained, the fluorescence spectrum of which gets closer to a linear combination of at least two elemental fluorescence spectra, where each elemental fluorescence spectrum refers to the fluorescence spectrum of the same crystal co-doped with only one type of buffer ion from the at least two types of buffer ions. The coefficient applied to each elemental fluorescence spectrum is equal to the mass proportion of the corresponding type of buffer ion, in the doped crystal according to the invention, multiplied by a scalar which represents the influence of this type of buffer ion on the fluorescence of the optically active ion. Thus, there is:

$$f_{Tot}(\lambda) = \sum_{i=1}^{N} \alpha_i * x_i * f_i(\lambda)$$

with $f_{Tot}(\lambda)$ a function which defines the fluorescence spectrum of a doped crystal according to the invention, with at least two types of buffer ions;

$\alpha_i$ the mass proportion of the i-th type of buffer ion in the doped crystal according to the invention, with a total of N types of buffer ions, where N is an integer greater than or equal to 2;

$x_i$ is a scalar which represents the influence of the i-th type of buffer ion on the fluorescence of the optically active ion in the doped crystal according to the invention; and $f_i(\lambda)$ is a function which defines the fluorescence spectrum of the same crystal as the doped crystal according to the invention, except that it is co-doped only with the i th type of buffer ion.

A doped crystal can thus be obtained, the fluorescence spectrum (and consequently the amplification spectrum) of which has a desired shape, in particular in terms of width, central wavelength and structuring.

In particular, a doped crystal can be obtained with an amplification spectrum with a full width at half maximum of at least 3 nm (1 nm=$10^{-9}$ m) or even at least 5 nm. Since the pulse duration and the spectral width of the amplification spectrum are inversely proportional, a broad, low structured amplification spectrum is particularly advantageous for producing laser pulses of short duration, especially lower than 1 picosecond. A low structured spectrum refers to a spectrum having a low spectral gain gradient about its maximum. Preferably, buffer ions are joined in a doped crystal according to the invention with elemental spectra that are far apart from each other. In particular, buffer ions associated with elemental spectra centred on respective central wavelengths at least 3 nm apart are advantageously joined.

It is noticed that curves 11 to 16 in FIG. 1 are elemental spectra associated with a $CaF_2$-doped crystal, doped with optically active neodymium $Nd^{3+}$ ions, and co-doped with at least two types of buffer ions.

Curve 11, associated with yttrium buffer ions, is the furthest from the other curves associated with lutetium, lanthanum, scandium, cerium, and gadolinium buffer ions respectively. It is therefore advantageous to join, within the same $CaF_2$-doped crystal according to the invention, optically active $Nd^{3+}$ ions, yttrium buffer ions and buffer ions of at least one other rare earth from lutetium, lanthanum, scandium, cerium and gadolinium.

In FIG. 1, curves 11 and 16, associated with yttrium and gadolinium buffer ions respectively, are the two curves furthest apart. Thus, yttrium buffer ions and gadolinium buffer ions are advantageously joined within the same crystal according to the invention, as buffer ions of two distinct types in a $CaF_2$-doped crystal doped with optically active neodymium $Nd^{3+}$ ions and co-doped with at least two types of buffer ions.

The doped crystal according to the invention, because of its crystal structure, further has a thermal conductivity of the same order of magnitude as that of the doped crystals of prior art, about ten times greater than that of doped glasses.

Figure 2:
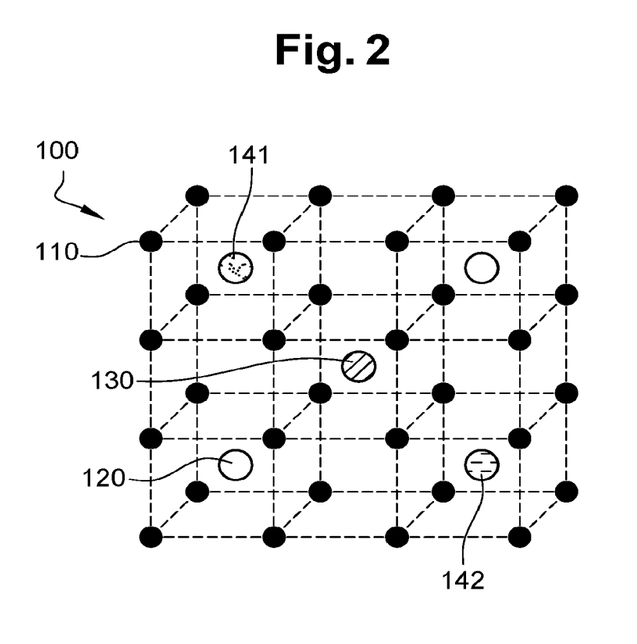
FIG. 2 schematically illustrates the structure of a doped crystal according to the invention.

FIG. 2 schematically illustrates the structure of a doped crystal 100 according to the invention, consisting of an $X-F_2$-doped crystal.

In FIG. 2, fluorine (F) ions are represented by a black disc 110 and ions of the chemical element X ($X^{2+}$) are represented by a white disc 120. The arrangement of fluorine ions and ions of the chemical element X is here of the face-centred cubic type, with fluorine ions 110 being arranged on the corners of the cubes and ions 120 of the chemical element X being arranged on the centres of the faces of the cubes. In the absence of doping, every second cube contains an ion of the chemical element X.

The $X-F_2$ doped crystal is doped with trivalent ions of rare earth called dopant ions. A trivalent ion refers to an ion capable of forming up to three covalent bonds. Trivalent dopant ions have a positive electrical charge, here corresponding to the charge of three protons. A rare earth refers to a chemical element of the rare earth family, the rare earth family including scandium (Sc), yttrium (Y), and lanthanides. Lanthanides are chemical elements with atomic numbers ranging from 57 to 71, and gathering lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

Among the dopant ions, there are two categories:
a first category in which each dopant ion is an ion of a first rare earth; and
a second category in which each dopant ion is an ion of a second rare earth distinct from the first rare earth.

The dopant ions in the first category are called optically active ions. These are the ions originating the laser effect in the doped crystal 100. Optically active dopant ions are, for example, trivalent neodymium($Nd^{3+}$) ions or trivalent ytterbium ($Yb^{3+}$) ions, more preferentially trivalent neodymium ions. In the following, for the sake of clarity, the description continues with the example of optically active ions consisting of trivalent neodymium ions.

Dopant ions of the second category are called buffer ions, noted as $Bu^{3+}$. They are considered to be optically inactive or neutral, as they do not directly originate the laser effect used in the doped crystal 100. They simply promote the formation of aggregates of at least one neodymium ion and at least one buffer ion, to the detriment of aggregates only gathering neodymium ions, and detrimental to the efficiency and spectral width of laser amplification by neodymium ions.

Buffer ions advantageously include trivalent lutetium ($Lu^{3+}$) ions, trivalent yttrium ($Y^{3+}$) ions, trivalent gadolinium ($Gd^{3+}$) ions, trivalent lanthanum ($La^{3+}$) ions, trivalent scandium ($Sc^{3+}$) ions and/or trivalent cerium ($Ce^{3+}$) ions. These are trivalent ions of rare earth that can easily enter the composition of the $X—F_2$ crystal without quenching the luminescence of the optically active $Nd^{3+}$ ion.

Buffer ions of the doped crystal 100 are of at least two types, which differ in the nature of the corresponding rare earth. In other words, the buffer ions include, at least, buffer ions of a second rare earth (distinct from the first rare earth) and buffer ions of a third rare earth distinct from the second rare earth (and the first rare earth).

Each of the individual dopant ions replaces an $X^{2+}$ ion in the face-centred cubic arrangement of the crystal. The dopant ions suitable for replacing an $X^{2+}$ ion in the face-centred cubic arrangement are preferably ions having a size comparable to that of the $X^{2+}$ ion. In FIG. 2, an optically active ion has been represented by a hatched disc 130, a buffer ion of the second rare earth by a dot-filled disc 141 and a buffer ion of the third rare earth by a serration-filled disc 142. The different types of dopant ions 130, 141, 142 are homogeneously distributed in the doped crystal 100, where each type of dopant ion relates to a specific rare earth.

Doping requires electrical charge compensation, which is carried out by $F^-$ ions at interstitial positions in the cube lattice. For the sake of clarity, these $F^-$ ions at interstitial positions are not represented in FIG. 2.

FIG. 2 is not representative of the advantageous proportions of the optically active ions 130 and of the different types of buffer ions in the doped crystal 100.

The mass proportion of the buffer ions of the second rare earth in the doped crystal 100 is advantageously greater than or equal to 1%, and even greater than or equal to 2%, and preferably within 5%.

In the same way, the mass proportion of the buffer ions of the third rare earth in the doped crystal 100 is advantageously greater than or equal to 1%, and even greater than or equal to 2%, and preferably within 5%. Advantageously, the same applies to all types of buffer ions in the doped crystal according to the invention, where each type of buffer ion relates to a given rare earth.

Further, the mass proportion of all buffer ions in the crystal remains advantageously between 2% and 8% by mass, more preferentially between 3% and 7%, even more preferentially between 4% and 6%. Below a low limit value, the mass proportion of buffer ions is not always sufficient to keep the optically active ions in the doped crystal 100 sufficiently far apart from each other, and thus to limit the formation of aggregates of several optically active ions sufficiently. Above a high limit value, there is a risk of deforming the crystal lattice of the doped crystal 100 and thus reducing its thermal conductivity. It is even possible to completely change the crystal structure and obtain a new crystal that does not have the desired physical properties.

Finally, the mass proportion of all doped ions in the doped crystal (optically active ions and buffer ions) is preferably lower than or equal to 20%, with at least 0.3% by mass and even at least 0.5% by mass of optically active dopant ions.

Advantageously, the doped crystal 100 only consists of the $X—F_2$ matrix doped with optically active ions and at least two types of buffer ions (elements that may be present only in trace amounts in mass proportions lower than or equal to 0.05% are preferably ignored).

According to one advantageous embodiment, the buffer ions consist of only two types of buffer ions: buffer ions of a second rare earth (distinct from the first rare earth) and buffer ions of a third rare earth distinct from the second rare earth (and the first rare earth).

Alternatively, buffer ions may consist of three types of buffer ions: buffer ions of a second rare earth (distinct from the first rare earth), buffer ions of a third rare earth distinct from the second rare earth (and the first rare earth), and buffer ions of a fourth rare earth distinct from the second and third rare earths (and the first rare earth). Crystals with buffer ions of more than three types are not excluded, but preference is given to alternatives with two or three types of buffer ions, which make it easier to obtain a homogeneous spatial distribution of the different types of dopant ions in the doped crystal 100.

Figure 3:
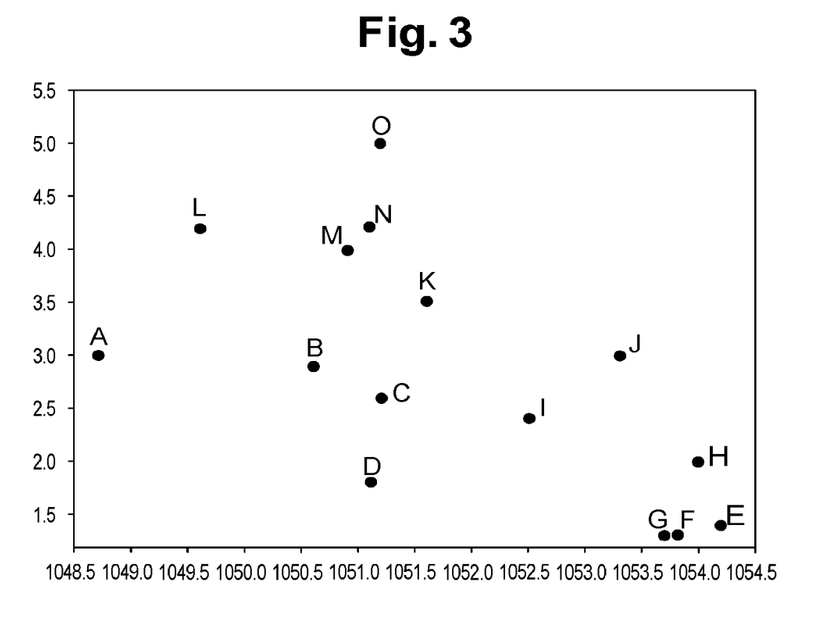
FIG. 3 illustrates, for a plurality of doped crystals according to the invention and according to prior art, the characteristics of their respective amplification spectra in terms of spectral width and central wavelength.

FIG. 3 illustrates, for a plurality of doped crystals according to the invention and according to prior art, the characteristics of their respective amplification spectra. The abscissa axis is a central wavelength of the amplification spectrum, in nm. The ordinate axis is a full width at half maximum of the amplification spectrum, in nm.

All crystals are fluorite ($CaF_2$) doped crystals, doped with optically active neodymium ($Nd^{3+}$) ions, and further doped with buffer ions of at least one type, where each type of buffer ion relates to a given rare earth. The amplification spectra are measured in the presence of optical pumping at 796 nm.

In FIG. 3, a series of points A to O have been identified, which respectively correspond to the following compositions for the buffer ions:
A: 5% by mass of gadolinium;
B: 5% by mass of cerium;
C: 5% by mass of lanthanum;
D: 5% by mass of scandium;
E: 5% by mass of yttrium;
F: 5% by mass of lutetium;
G: 2.5% by mass of gadolinium and 2.5% by mass of lutetium;
H: 1% by mass of gadolinium and 4% by mass of yttrium;
I: 2.5% by mass of lanthanum and 2.5% by mass of yttrium;

J: 2.5% by mass of gadolinium and 2.5% by mass of yttrium;

K: 2.5% by mass of lanthanum and 2.5% by mass of gadolinium;

L: 4% by mass of gadolinium and 1% by mass of yttrium;

M: 1% by mass of gadolinium, 2% by mass of yttrium, and 2% by mass of lanthanum;

N: 1% by mass of gadolinium, 2% by mass of lutetium, and 2% by mass of lanthanum;

O: 3.68% by mass of gadolinium, 0.55% by mass of lutetium, and 0.65% by mass of lanthanum.

Points A to F relate to doped crystals according to prior art, with only one type of buffer ion. It is seen in FIG. 3 that they do not enable a full width at half maximum greater than 3 nm to be obtained. Further, the spectral full width at half maximum at 1053 nm is particularly low, in the order of 1 nm.

Points G to O relate to doped crystals according to the invention with two types of buffer ions (points G to L) or three types of buffer ions (points M to O). It is seen that the doped crystals according to the invention make it possible to achieve spectral full widths at half maximum much greater than those obtained in prior art, up to 5 nm with three types of buffer ions (point O).

Further, for a given central wavelength, for example 1053 nm, a full width at half maximum which is much greater than that of prior art at the same wavelength can be obtained. In particular, buffer ions consisting of 2.5% by mass of gadolinium and 2.5% by mass of yttrium (point J) enable a full width at half maximum of 3 nm at 1053.3 nm to be obtained, versus 1 nm at 1053.6 nm with a doped crystal of prior art (point F).

It is thus shown that by cleverly selecting the nature and mass concentrations of the buffer ions in a crystal according to the invention, a broad amplification spectral band centred on a desired wavelength can be obtained. It is thus possible to provide a doped crystal capable of replacing any doped glass in a complex laser system, keeping the same amplification wavelength as the doped glass and thus without any particular adaptation of the rest of said complex laser system. Replacing a doped glass by a doped crystal according to the invention enables the energy efficiency to be improved by virtue of an improved thermal conductivity, while maintaining spectral properties in amplification by virtue of several types of carefully selected buffer ions.

Figure 4:
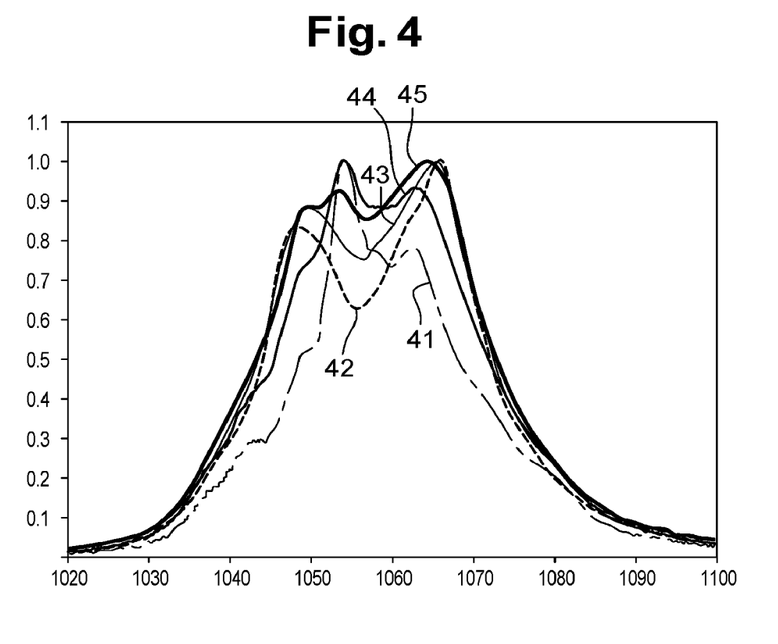
FIG. 4 illustrates respective fluorescence spectra of crystals according to prior art and crystals according to a particularly advantageous embodiment of the invention.

In FIG. 4 fluorescence spectra obtained with doped crystals according to prior art are compared with doped crystals according to the invention, for a same $CaF_2$ matrix doped with optically active neodymium ions and with yttrium and/or gadolinium buffer ions. The abscissa axis is a wavelength, in nm. The ordinate axis is here a light intensity in arbitrary units. Fluorescence spectra are measured in the presence of optical pumping at 796 nm. Each spectrum is normalized relative to its maximum. Each fluorescence spectrum corresponds to an emission spectrum of the doped crystal, without the contribution of a light beam to be amplified. The same trends in the fluorescence spectrum as the amplification spectrum are found, especially in terms of spectral width, structuring and central wavelength.

Curve 41 corresponds to the fluorescence spectrum of an $Nd^{3+}$-doped $CaF_2$ crystal, co-doped with buffer ions consisting of yttrium ions only. Curve 41 here shows a peak centred at about 1054 nm, with less bounce about 1063 nm.

Curve 42 corresponds to the fluorescence spectrum of an $Nd^{3+}$-doped $CaF_2$ crystal, co-doped with buffer ions consisting of gadolinium ions only. Curve 42 here shows a peak centred at about 1066 nm, with less bounce about 1048 nm.

Curves 43, 44, 45 correspond to the fluorescence spectra of an $Nd^{3+}$-doped $CaF_2$ crystal, co-doped with buffer ions consisting of gadolinium ions and yttrium ions, with 4% by mass of gadolinium ions and 1% by mass of yttrium ions (curve 43), respectively 1% by mass of gadolinium ions and 4% by mass of yttrium ions (curve 44), and respectively 2.5% by mass of gadolinium ions and 2.5% by mass of yttrium ions (curve 45).

Each of the curves 43 to 45 has a broad spectral band over which the light intensity remains greater than or equal to 75% of the maximum.

Each of the curves 43 to 45 has a shape with a maximum, a bounce close to the maximum, and a hardly marked trough in between. In other words, the gradient of light intensity about the maximum is limited, much lower than the gradients of light intensity about the maximum on curves 41 and 42. The fluorescence spectrum is all the flatter about the maximum as one gets closer to the equality of the mass percentages of yttrium ions and gadolinium ions. According to one advantageous embodiment of the invention, the doped crystal is therefore an $Nd^{3+}$-doped $CaF_2$ crystal, co-doped with gadolinium and yttrium buffer ions, with a ratio of the highest value to the lowest value among the mass concentration of yttrium ions and mass concentration of gadolinium ions between 1 and 4, preferably between 1 and 2, and more preferentially between 1 and 1.5. Preferably a mass concentration of gadolinium and yttrium ions is further between 2% and 8%, more preferentially between 3% and 7%, even more preferentially between 4% and 6%.

Figure 5A:
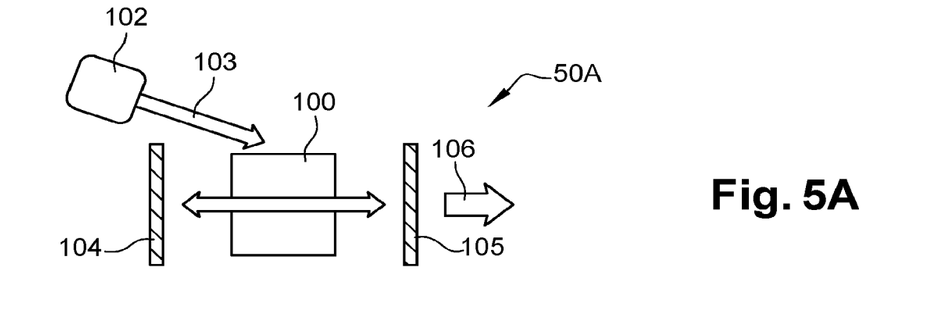
FIGS. 5A and 5B schematically illustrate two alternatives of a laser device according to the invention.

FIG. 5A illustrates a laser device 50A according to the invention, which includes a doped crystal 100 according to the invention, and a light source 102 configured to emit an excitation light beam 103 to the doped crystal 100. The spectrum of the excitation light beam 103 is centred at a wavelength capable of performing the population inversion required to obtain the laser effect in the doped crystal 100. In other words, the excitation light beam 103 delivers, to the doped crystal 100, the energy necessary to bring some of its atoms to a high energy level. The doped crystal 100 is placed inside an optical resonant cavity, here formed by two mirrors 104, 105 which are highly reflective at the wavelength of the stimulated emission in the doped crystal 100.

In operation, the doped crystal 100, optically pumped by the excitation light beam 103, emits first photons by spontaneous emission. These first photons cause the emission of new photons by stimulated emission, which circulate in a loop in the resonant optical cavity and in turn cause the emission of new photons by stimulated emission, until a light beam 106 is formed at the output of the resonant optical cavity.

Figure 5B:
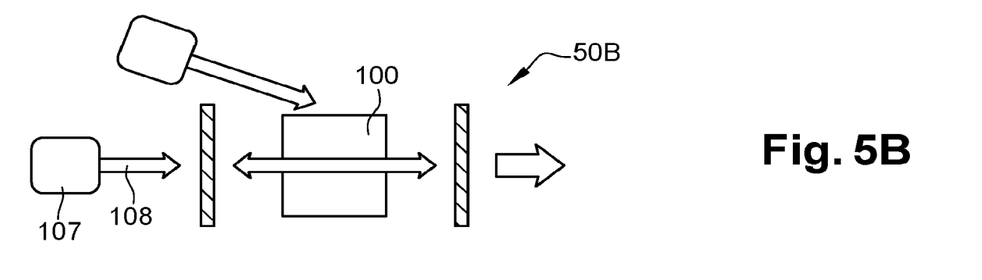

FIG. 5B illustrates an alternative in which the doped crystal 100 according to the invention is used as an amplifier, rather than to emit a light beam. The laser device 50B in FIG. 5B is only described as for its differences relative to the device in FIG. 5A. The device 50B here includes a light source 107, to emit a light beam to be amplified 108. The light beam to be amplified 108 is brought to the doped crystal 108, where it causes the stimulated emission and triggers the amplification mechanism. The spectrum of the light beam to be amplified 108 and the amplification spectrum of the doped crystal 100 are at least partially superimposed with each other.

Figure 6:
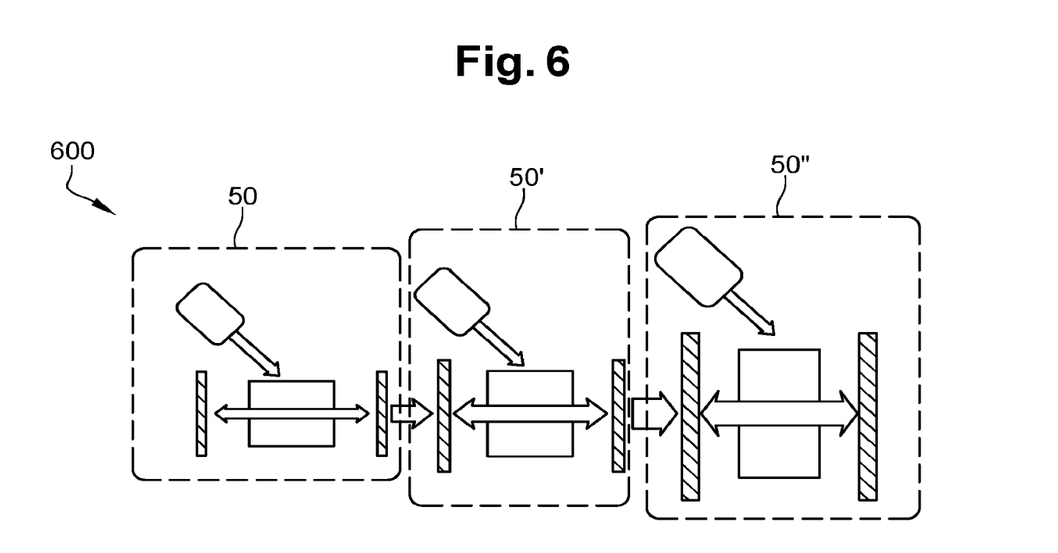
FIG. 6 schematically illustrates a laser system according to the invention, with several cascaded laser devices.

FIG. 6 schematically illustrates a system 600 including a plurality of cascaded laser amplification devices 50, 50', 50". The term "cascaded" means that the laser amplification devices 50, 50', 50" form an open system in which the light beam emitted at the output of one of the devices is injected at the input of the next device. The output of the last laser amplification device is not fed back at the input of another of said devices.

At least one of the devices 50, 50', 50" is a device according to the invention, in which the amplifying medium is a crystal doped with optically active ions and with buffer ions of at least two distinct types. In the example represented here, but optionally, each laser amplification device includes an optically resonant cavity at the wavelength of the stimulated emission in the amplifying medium.

At least one of the devices 50, 50', 50" may be a device according to prior art, in which the amplifying medium is a crystal doped with optically active ions of a first rare earth, and possibly with buffer ions of one and the same rare earth.

In the examples above, the example of a fluorite ($CaF_2$)-doped crystal, doped especially with optically active neodymium $Nd^{3+}$ ions, has been more particularly illustrated. However, the invention is not limited to this example, and the principle of the invention can be applied in the same way to all kinds of $X-F_2$ type doped crystals, where X is a chemical element of the alkaline earth family, doped especially with optically active ions of a rare earth which may be different from neodymium, for example ytterbium.

The doped crystal according to the invention can be synthesized especially by the so-called Bridgman method. According to this method, the materials to be grown are placed in a crucible, and then introduced into a controlled-atmosphere enclosure and heated to a temperature greater than their melting point to homogenise the mixture. One of the ends of the crucible is open to a so-called seed crystal, and the materials in liquid form are slowly cooled from this end of the crucible, with a temperature gradient to ensure gradual crystallization. From the seed crystal, a crystal with the same crystallographic orientation as the seed crystal and made of the materials present in the liquid phase in the crucible is formed. $X-F_2$ in crystallised form, for example, is used as starting material. The dopant ions are obtained from $Me_2O_3$ type oxide powders, where O refers to oxygen and Me refers to the chemical element corresponding to the dopant ion. The oxide powders are converted to $MeF_3$ by fluorination in an $NH_4HF_2$ bath. After weighing, the materials are introduced into the crucible. The crucible is for example of graphite, cylindrical in shape, with a 2 mm diameter channel in its lower part to initiate crystal formation on the seed crystal side.

The invention offers an amplifying medium for obtaining a desired shape of the amplification spectrum and high thermal conductivity. It especially makes it possible to obtain an amplifying medium which has an amplification spectrum comparable to that of a doped glass such as phosphate, and a thermal conductivity comparable to that of a crystal. It especially enables a laser amplification crystal to be obtained, with a broad amplification spectral band and a controlled profile over said band. The amplification spectral band preferably refers to a spectral band over which the amplification factor remains greater than or equal to 50% of the maximum.

The invention finds particularly advantageous application for emitting a light beam about 1 μm, and more preferentially between 1040 and 1070 nm, in particular at 1053 nm. It further applies to the production of high energy laser pulses.

The invention claimed is:

1. An amplifying medium for at least one of emitting and amplifying a light beam by laser effect, consisting of an $X-F_2$ doped crystal, where X refers to a chemical element of the alkaline earth family and F refers to fluorine, and where the crystal is doped with trivalent ions of rare earth, called dopant ions, said dopant ions comprising:
   a first category of optically active dopant ions, in which each dopant ion is an ion of a first rare earth; and
   a second category of dopant ions, called buffer ions, optically inactive in that they do not directly cause the laser effect utilized in the doped crystal, being used only to limit formation of aggregates of several ions of the first category of dopant ions, wherein each dopant ion of the second category is an ion of a rare earth distinct from the first rare earth;
   wherein the second category of dopant ions includes at least ions of a second rare earth and ions of a third rare earth, the second rare earth and the third rare earth being distinct from each other; and
   wherein the ions of the second rare earth and ions of the third rare earth are associated with elemental fluorescence spectra centered on respective central wavelengths at least 3 nm apart, where each elemental fluorescence spectrum refers to a fluorescence spectrum of the same crystal, doped with the same dopant ions of the first category of dopant ions and co-doped only with ions of the second rare earth and the third rare earth, respectively.

2. The amplifying medium according to claim 1, wherein a mass concentration of ions of the second rare earth is greater than or equal to 1% by mass, and a mass concentration of ions of the third rare earth is greater than or equal to 1% by mass.

3. The amplifying medium according to claim 2, wherein a mass concentration of ions of the second rare earth is greater than or equal to 2% by mass, and in that its mass concentration of ions of the third rare earth is greater than or equal to 2% by mass.

4. The amplifying medium according to claim 1, wherein a mass concentration of buffer ions is between 4% and 6%.

5. The amplifying medium according to claim 1, wherein said buffer ions include at least one of lutetium, yttrium, gadolinium, lanthanum, scandium and cerium ions.

6. The amplifying medium according to claim 5, wherein said buffer ions include yttrium ions.

7. The amplifying medium according to claim 1, wherein said second category of dopant ions consists of said ions of the second rare earth and said ions of the third rare earth only.

8. The amplifying medium according to claim 7, wherein the second rare earth is yttrium and the third rare earth is gadolinium.

9. The amplifying medium according to claim 1, wherein said second category of dopant ions only consists of said ions of the second rare earth, said ions of the third rare earth, and ions of a fourth rare earth distinct from the second and third rare earths.

10. The amplifying medium according to claim 1, wherein the chemical element X comprises one of calcium, strontium and barium.

11. The amplifying medium according to claim 10, consisting of a fluorite-doped crystal, where the fluorite has a formula $CaF_2$.

12. The amplifying medium according to claim 1, wherein the optically active ions are one of neodymium ions and ytterbium ions.

13. A laser device including an amplifying medium according to claim 1, and a light source arranged to emit an excitation light beam in a direction of the amplifying medium, the excitation light beam being capable of optically exciting the amplifying medium so that the latter one of emits and amplifies an auxiliary light beam by laser effect.

14. The laser device according to claim 13, further comprising a light source configured to emit a light beam to be amplified in the direction of the amplifying medium, the amplifying medium being configured to amplify said light beam to be amplified by laser effect.

15. The laser system including a plurality of laser devices cascaded one after the other, each laser device comprising an amplifying medium and a light source arranged to emit an excitation light beam in the direction of said amplifying medium, wherein each excitation light beam is capable of optically exciting the corresponding amplifying medium so that the latter one of emits and amplifies a light beam by laser effect, and wherein at least one of said laser devices is a laser device according to claim 13.

* * * * *